(12) United States Patent
Chang et al.

(10) Patent No.: US 12,512,445 B2
(45) Date of Patent: Dec. 30, 2025

(54) PACKAGE STRUCTURE, SEMICONDUCTOR DEVICE AND MANUFACTURING METHOD THEREOF

(71) Applicant: Taiwan Semiconductor Manufacturing Company, Ltd., Hsinchu (TW)

(72) Inventors: Fong-yuan Chang, Hsinchu County (TW); Lee-Chung Lu, Taipei (TW); Jyh Chwen Frank Lee, Palo Alto, CA (US); Po-Hsiang Huang, Tainan (TW); Xinyu Bao, Fremont, CA (US); Sam Vaziri, San Jose, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/367,867

(22) Filed: Jul. 6, 2021

(65) Prior Publication Data

US 2022/0149020 A1 May 12, 2022

Related U.S. Application Data

(60) Provisional application No. 63/111,878, filed on Nov. 10, 2020.

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4857* (2013.01); *H01L 23/3735* (2013.01);
(Continued)

(58) Field of Classification Search
CPC ........... H01L 21/4857; H01L 23/49822; H01L 24/19–20; H01L 2224/19–22505;
(Continued)

(56) References Cited

U.S. PATENT DOCUMENTS

2010/0308453 A1  12/2010  Scheid et al.
2015/0145142 A1  5/2015   Lin et al.
(Continued)

FOREIGN PATENT DOCUMENTS

CN  108624218 A  * 10/2018  ............. C08G 59/42
CN  110612603 A    12/2019
(Continued)

OTHER PUBLICATIONS

Havemann, "High Performance Interconnects: An Integration Overview," Proceedings of the IEEE, vol. 89, No. 5, May 2001, pp. 586-601 (Year: 2001).*

*Primary Examiner* — Evan G Clinton
(74) *Attorney, Agent, or Firm* — Finnegan, Henderson, Farabow, Garrett & Dunner, L.L.P.

(57) ABSTRACT

A package structure includes a solder feature, a first redistribution layer structure on the solder feature, and a die mounted on and electrically coupled to the first redistribution layer structure. The first redistribution layer structure includes one or more dielectric layers filled with a heat conductive dielectric material.

20 Claims, 17 Drawing Sheets

(51) Int. Cl.
*H01L 23/373* (2006.01)
*H01L 23/498* (2006.01)

(52) U.S. Cl.
CPC .. *H01L 23/49816* (2013.01); *H01L 23/49822* (2013.01); *H01L 23/49838* (2013.01); *H01L 23/49833* (2013.01); *H01L 2225/1023* (2013.01); *H01L 2225/1058* (2013.01); *H01L 2225/1094* (2013.01)

(58) Field of Classification Search
CPC ............. H01L 2224/96; H01L 25/0657; H01L 25/074; H01L 23/3735; H01L 2224/73259; H01L 2224/73267; H01L 2224/92244; H01L 2224/0231; H01L 2224/0239
See application file for complete search history.

(56) References Cited

U.S. PATENT DOCUMENTS

| | | | |
|---|---|---|---|
| 2015/0206799 A1* | 7/2015 | Yu | H01L 21/563 438/622 |
| 2015/0371932 A1* | 12/2015 | Hu | H01L 21/4825 438/123 |
| 2016/0086885 A1* | 3/2016 | Inagaki | H01L 23/5386 257/774 |
| 2016/0093572 A1* | 3/2016 | Chen | H01L 23/5389 438/126 |
| 2017/0345714 A1 | 11/2017 | Scharf et al. | |
| 2017/0352628 A1 | 12/2017 | Furuichi et al. | |
| 2018/0226350 A1 | 8/2018 | Lee et al. | |
| 2018/0350765 A1* | 12/2018 | Chang | H01L 25/105 |
| 2019/0371781 A1* | 12/2019 | Huang | H01L 21/486 |
| 2020/0123428 A1* | 4/2020 | Sugimoto | B32B 15/08 |
| 2020/0194362 A1 | 6/2020 | Park et al. | |
| 2020/0266178 A1* | 8/2020 | Lee | H01L 23/13 |
| 2020/0343184 A1* | 10/2020 | Fujishima | H01L 23/481 |
| 2021/0183722 A1* | 6/2021 | Anderson | H01L 23/3121 |
| 2021/0327819 A1* | 10/2021 | Fang | H01L 24/05 |

FOREIGN PATENT DOCUMENTS

| | | |
|---|---|---|
| JP | 2017220543 A | 12/2017 |
| JP | 2020-113748 A | 7/2020 |
| KR | 20180090666 A | 8/2018 |
| KR | 20200075994 A | 6/2020 |
| TW | 201916280 A | 4/2019 |
| WO | WO 2020/078939 A1 | 4/2020 |
| WO | WO-2021181468 A1 * | 9/2021 |

* cited by examiner

200

PACKAGE STRUCTURE, SEMICONDUCTOR DEVICE AND MANUFACTURING METHOD THEREOF

REFERENCE TO RELATED APPLICATION

This application claims the benefit of U.S. Provisional Application No. 63/111,878, filed on Nov. 10, 2020, entitled "PACKAGE STRUCTURE WITH THICK REDISTRIBUTION LAYER AND HEAT-CONDUCTIVE DIELECTRIC MATERIAL," the entirety of which is incorporated by reference herein.

BACKGROUND

A 3D integrated circuit (3DIC) includes a semiconductor device with two or more layers of active electronic components vertically stacked and connected to form an integrated circuit. Heat dissipation is a challenge in the 3DICs because 3D IC systems with increased chip density can exhibit high heat density and poor thermal dissipation performance.

The heat generated in the inner dies of a 3DIC may be trapped in an inner region of a bottom stacked die and cause a sharp local temperature peak, sometimes referred to as a hot spot. Hot spots due to heat generated by devices may negatively affect the electrical performance of other overlaying devices in the stacked dies and often lead to electromigration and reliability issues for the 3DIC packages. There is a need to solve the above deficiencies and problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
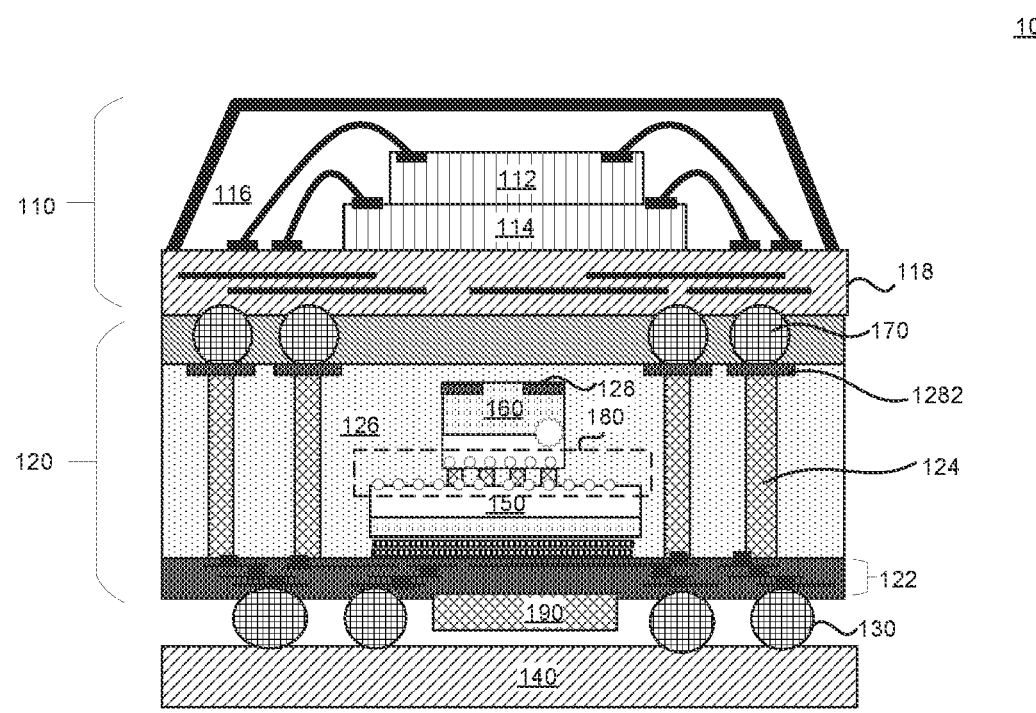
FIG. 1 is a cross sectional view of a package-on-package (PoP) device, in accordance with exemplary embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Various embodiments of the present disclosure will be described with respect to embodiments in a specific context, namely a three-dimensional (3D) integrated fan-out (InFO) package-on-package (PoP) device. The concepts in the disclosure may also apply, however, to other semiconductor structures or circuits.

FIG. 1 is a cross sectional view of a package-on-package (PoP) device 100, in accordance with some embodiments of the present disclosure. As shown in FIG. 1, the PoP device 100 includes a top package 110 electrically coupled to a bottom package 120 using one or more redistribution layers formed in an Integrated Fan Out Package on Package (InFO PoP) device, which will be described in more detail below. In some implementations, the top package 110 and the bottom package 120 may include various other components, layers, circuits, and structures, which are omitted herein for the sake of brevity.

As shown in FIG. 1, the top package 110 is mounted above the bottom package 120. The top package 110 may include one or more device dies 112, 114. In some embodiments, the device die(s) 112, 114 are vertically discrete memory components. For example, the device die(s) 112, 114 may be memory components such as, for example, a dynamic random-access memory (DRAM) or other suitable type of memory devices. While two device dies 112, 114 are depicted in FIG. 1, the present disclosure is not limited thereto. In various embodiments, the top package 110 may include any numbers of the device die(s) 112, 114.

In some embodiments, the device dies 112, 114 in the top package 110 are electrically coupled to the bottom package 120 through wiring bonding(s) as well as vias and contact pads in a top package substrate 118. The top package 110 may include molding material 116 or another suitable encapsulant to cover the device dies 112, 114 and to protect the wire bonding connections.

At a front side of the bottom package 120, the bottom package 120 includes a bottom package substrate. In some embodiments, the bottom package substrate is a polybenzoxaxole (PBO) or other suitable substrate material. As shown in FIG. 1, one or more solder features 130 are mounted to the bottom package substrate to be the electrical connector(s). In some embodiments, the solder feature(s) 130 are formed from solder balls from a ball grid array (BGA). As shown, the solder feature(s) 130 permit the bottom package 120 to be mounted and electrically coupled to, for example, an underlying printed circuit board (PCB) 140 or other component(s). In some embodiments, one or more integrated passive devices (IPDs) 190 can be mounted under the bottom package 120 and located between the bottom package 120 and the underlying printed circuit board 140.

As shown in FIG. 1, the bottom package 120 includes a front side redistribution layer (RDL) structure 122 in the bottom package substrate. The front side RDL structure 122 electrically couples a device die 150 in the bottom package 120 to, for example, the solder features 130 and the printed circuit board 140. In some embodiments, the device dies 150 and 160 in the bottom package 120 are logic devices or logic components, such as logic integrated circuits, analog circuits, etc. The device dies 150 and 160 can be encapsulated by a molding material 126 or any other suitable encapsulant to cover the device dies 150 and 160. While two device dies 150 and 160 are vertically stacked and connected to each other via conductive features as depicted in FIG. 1, in some other embodiments, the bottom package 120 may include any numbers of device dies integrated and encapsulated by the molding material 126.

In some embodiments, the device dies 150 and 160 can be mounted beneath or to a passivation layer using a die attach film (DAF). In some embodiments, the passivation layer includes polybenzoxaxole (PBO), an Ajinomoto build-up film (ABF), or other suitable material. A buffer layer including PBO, ABF, or other suitable material, may be disposed over the passivation layer. Optionally, a laminating tape may be disposed over the buffer layer. The laminating tape can include a solder release (SR) film, an ABF, a backside laminating coating tape (LC tape) including a thermosetting polymer or other suitable material. In some embodiments, an underfill material may be used to encapsulate portions of the top package 110 and the bottom package 120. The underfill material may extend from a top surface of the printed circuit board 140, along sides of the bottom package 120, and along a portion of the sides of the top package 110. In some embodiments, the underfill material can be disposed between the top package substrate 118 and the laminating tape or the buffer layer.

Still referring to FIG. 1, the bottom package 120 also includes through package vias (TPV) 124 penetrating through the molding material 126 and extending between the front side and the backside of the bottom package 120. The through package vias 124, which may also be referred to herein as through InFO vias (TIVs) or metal vias, are embedded in and pass through the molding material 126. In some embodiments, the through package vias 124 include one or more of copper, nickel (Ni), a copper alloy (copper/titanium), solder, a solder alloy including tin-silver (SnAg), tin-bismuth (SnBi), tin-copper (SnCu), tin-silver-copper (SnAgCu), tin-silver-copper-nickel (SnAgCuNi), or combinations thereof, or another suitable metal. While four through package vias 124 are illustrated in FIG. 1, in some other embodiments, more or fewer of the through package vias 124 may be included in the bottom package 120.

In some embodiments, the bottom package 120 also includes a backside RDL structure 128. In some implementations, a portion of the backside RDL structure 128 can extend over a top surface of the device die 160. As such, the device die 160 is electrically coupled to, for example, the device dies 112 and 114 in the top package 110 and the through package vias 124. In addition, another portion of the backside RDL structure 128 can extend over the through package vias 124. In particular, redistribution layer bond pads 1282 from the backside RDL structure 128 are disposed on the upper portions of the through package vias 124 and cap or otherwise cover the top of the through package vias 124 in FIG. 1. Accordingly, the backside RDL structure 128 can be electrically coupled to the device die 160 and the front side RDL structure 122 via through package vias 124. In some embodiments, the redistribution layer bond pads 1282 and the through package vias 124 are formed from the same material (e.g., copper). Accordingly, the redistribution layer bond pads 1282 and the through package vias 124 may appear to be a single unitary structure.

Solder features 170 are formed or mounted on, and electrically coupled to, the redistribution layer bond pads 1282 and the through package vias 124. The solder features 170 electrically couple the top package 110 with the bottom package 120. In some embodiments, the solder features 170 are formed from solder paste, organic solderability preservative (OSP), or other suitable conductive material, or any combinations thereof. In some embodiments, an intermetallic compound (IMC) is disposed between the solder features 170 and the underlying redistribution layer bond pads 1282 capping the through package vias 124. The intermetallic compound is a product of a reflow process used to electrically couple the solder feature 170 and the through package vias 124.

In some other embodiments, three-dimensional integrated chips can be implemented in different ways, as the device 100 in FIG. 1 is merely an example and not meant to limit the present disclosure. For example, some semiconductor devices may implement a 3D System on an Integrated Chip ("3D SoIC") structure, which is a non-monolithic vertical structure that includes two to eight two-dimensional (2D) flip chips stacked on top of each other with different functionality, such as logic chips, memory chips, radio frequency (RF) chips, and the like. By way of example and not limitation, the logic chips can include central process units (CPUs) and the memory chips can include static access memory (SRAM) arrays, dynamic random-access memory (DRAM) arrays, magnetic random-access memory (MRAM) arrays, or other memory arrays. In the 3D SoIC structure, the 2D chips can be interconnected via microbumps, bonding pads, by through silicon vias (TSV), or by other interconnect structures.

Poor thermal dissipation performance in an IC package may lead to electromigration and reliability issues and result in poor IC performance. Different types of IC chips can have different thermal tolerances. For instance, memory chips, such as SRAM arrays, may have lower thermal tolerances compared to logic chips. In some advanced nodes, the chip speed may need to be reduced (e.g., by around 5% to 10%) to satisfy temperature requirements.

The power density of a 3D IC structure can be larger than a single die chip in the advanced node due to die stacking. These 3D IC structures have increased chip density and higher power density/heat density per unit area and bring greater challenges to thermal dissipation. For example, electromigration can increase the resistance of interconnects and TSVs, deteriorate the performance of the chips, and reduce the lifetime of the 3D IC structures. Reliability issues can arise due to the materials included in the 3D IC structures, which may include materials with different coefficients of thermal expansion (CTE). Materials with different CTE can result in thermo-mechanical stress between integrated circuit (IC) chips.

As shown in FIG. 1, the heat generated in the inner dies may be trapped in an inner region 180 of the bottom stacked device dies 150, 160 and cause a hot spot. In some embodiments, local hot spots can appear on any chip layer and are not limited to chip layers with logic chips. In order to provide a heat dissipation path that transfers heat generated by the device dies 150, 160 and spread out the heat, in some embodiments of the present disclosure, the front side RDL structure 122 may include one or more dielectric layers filled with a heat conductive dielectric material, such as materials with a thermal conductivity substantially equal to or greater than about 2 W/(m·K).

By forming dielectric layer(s) using heat-conductive but electrically insulating material in the front side RDL structure 122, the heat in the front side RDL structure 122 can be transferred and removed efficiently. By way of example and not limitation, the heat conductive dielectric material for the dielectric layer(s) can include one or more of aluminum nitride (AlN), boron nitride (BN), such as hexagonal boron nitride (h-BN), or any combinations thereof. Under certain temperature conditions (e.g., at 300K), aluminum nitride provides high thermal conductivity of up to about 285-321 W/(m·K), and is an electrical insulator with a static dielectric constant of about 8.5. Hexagonal boron nitride provides high thermal conductivity of up to about 400 W/(m·K) in plane and about 6 W/(m·K) out of plane, and is an electrical insulator with a static dielectric constant of about 6.9 in plane and a static dielectric constant of about 3.5 out of plane.

In some embodiments of the present disclosure, the front side RDL structure 122 may include one or more electrically conductive layers, and at least one of the electrically conductive layer(s) has a thickness substantially greater than 4 micrometers. In some embodiments, the thickness of one electrically conductive layer may be within about 4-10 micrometers. The thick electrically conductive layers in the front side RDL structure 122, such as metal layers, can also improve the heat conductivity of the front side RDL structure 122 and the heat dissipation between different layers in bottom package 120. Accordingly, one or more thermally conductive horizontal layers adjacent to the electrical connectors can be formed in the bottom package 120 to transfer the heat away from local hot spots.

For illustration, the manufacturing method of the bottom package 120 is described with reference to FIGS. 2-16. FIGS. 2-16 are cross sectional views of the Integrated Fan-Out (InFO) package 200 at different stages of an IC back-end-of-line (BEOL) manufacturing process, in accordance with some embodiments of the present disclosure.

While the manufacturing process is illustrated and described herein as a series of acts or events, it will be appreciated that the illustrated ordering of such acts or events are not to be interpreted in a limiting sense. For example, some steps may occur in different orders and/or concurrently with other steps or events apart from those illustrated and/or described herein. In addition, not all illustrated steps may be required to implement one or more aspects or embodiments of the description herein. Further, one or more of the steps depicted herein may be carried out in one or more separate steps and/or phases.

Figure 2:
FIGS. 2-16 are cross sectional views of an Integrated Fan-Out (InFO) package at different stages of an IC back-end-of-line (BEOL) manufacturing process, in accordance with exemplary embodiments of the present disclosure.

In FIG. 2, a carrier 201, an adhesive layer 202, and a polymer base layer 203 are provided. In some embodiments, the carrier 201 includes glass, ceramic, or other suitable material to provide structural support during the formation of various features in a device package. In some embodiments, the adhesive layer 202 including, for example, a glue layer, a light-to-heat conversion (LTHC) coating, an ultra-violet (UV) film or the like, is disposed over the carrier 201. The polymer base layer 203 is coated on the carrier 201 via the adhesive layer 202. In some embodiments, the polymer base layer 203 is formed of PolyBenzOxazole (PBO), Ajinomoto Buildup Film (ABF), polyimide, BenzoCycloButene (BCB), Solder Resist (SR) film, Die-Attach Film (DAF), or the like, but the present disclosure is not limited thereto.

Figure 3:
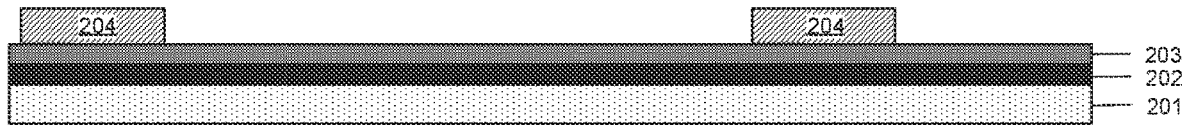

Referring now to FIG. 3, subsequently, a backside redistribution layer (RDL) 204 is formed. In some embodiments, the backside RDL 204 includes one or more redistribution lines, which are conductive features, including, for example, electrically conductive lines and/or vias, formed between one or more dielectric layers. In some embodiments, the dielectric layers are formed of aluminum nitride, boron nitride, or a combination thereof. In some embodiments, the dielectric layers are formed of other suitable material, including PI, PBO, BCB, epoxy, silicone, acrylates, nano-filled phenol resin, siloxane, a fluorinated polymer, polynorbornene, or the like, using any suitable method, including, for example, a spin-on coating technique, sputtering, and the like.

In some embodiments, conductive features/layers are formed between dielectric layers. The formation of such conductive features includes patterning dielectric layers using, for example, a combination of photolithography and etching processes, and forming the conductive features in the patterned dielectric layers by, for example, depositing a seed layer and using a mask layer to define the shape of the conductive features. The conductive features are designed to form functional circuits and input/output features for subsequently attached device dies.

Figure 4:
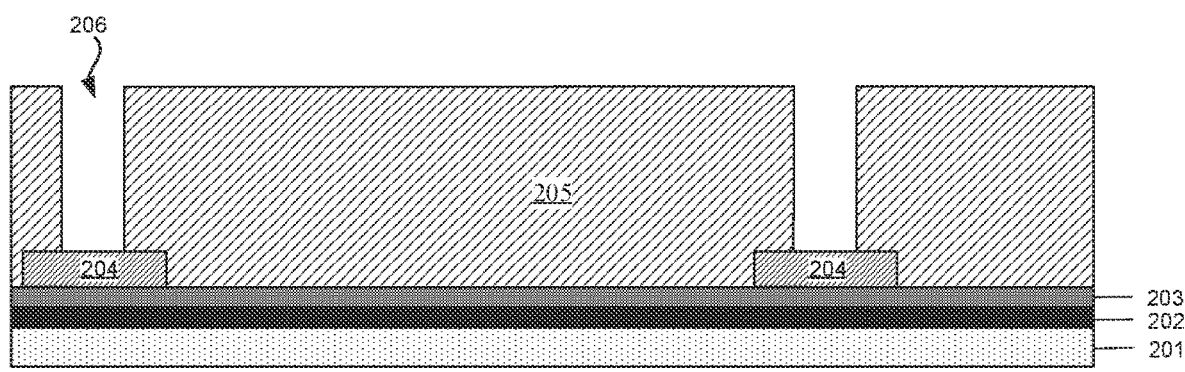

Referring now to FIG. 4, a patterned photoresist 205 is formed over the backside RDL 204 and the polymer base layer 203. In some embodiments, for example, the photoresist 205 is deposited as a blanket layer over backside RDL 204. Next, portions of the photoresist 205 are exposed using a photo mask (not shown). Exposed or unexposed portions of the photoresist 205 are then removed depending on whether a negative or positive resist is used. The resulting patterned photoresist 205 includes openings 206 disposed at peripheral areas of the carrier 201. In some embodiments, the openings 206 further expose conductive features in the backside RDL 204.

Figure 5:
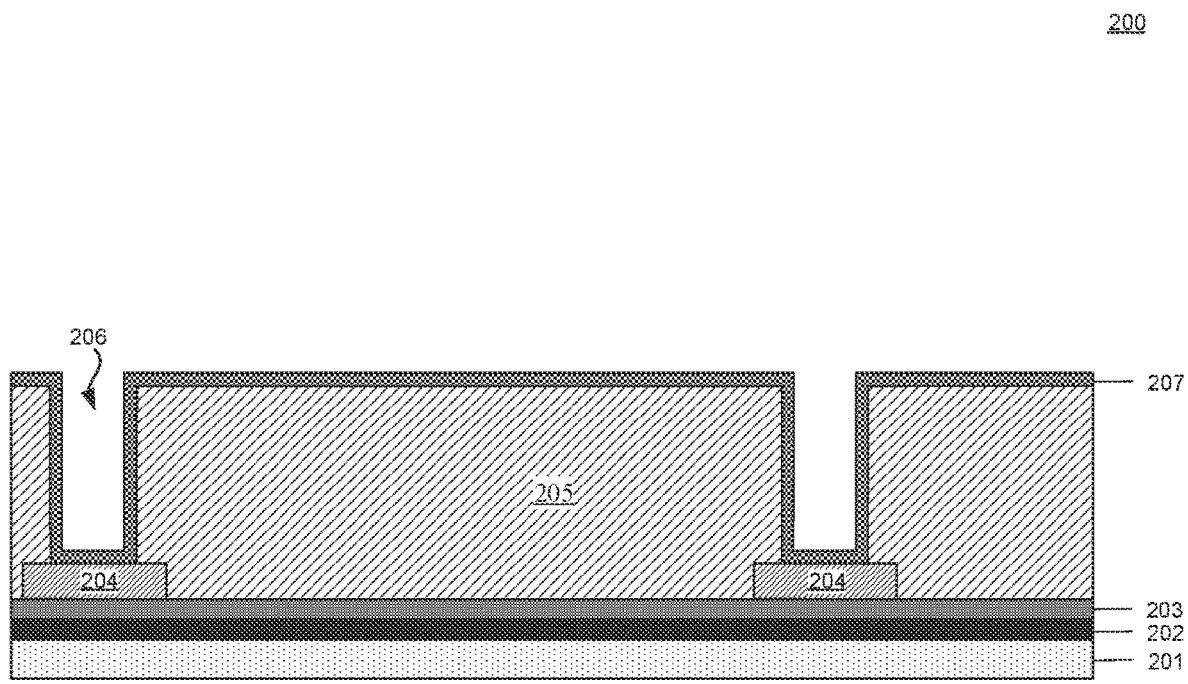
Figure 6:
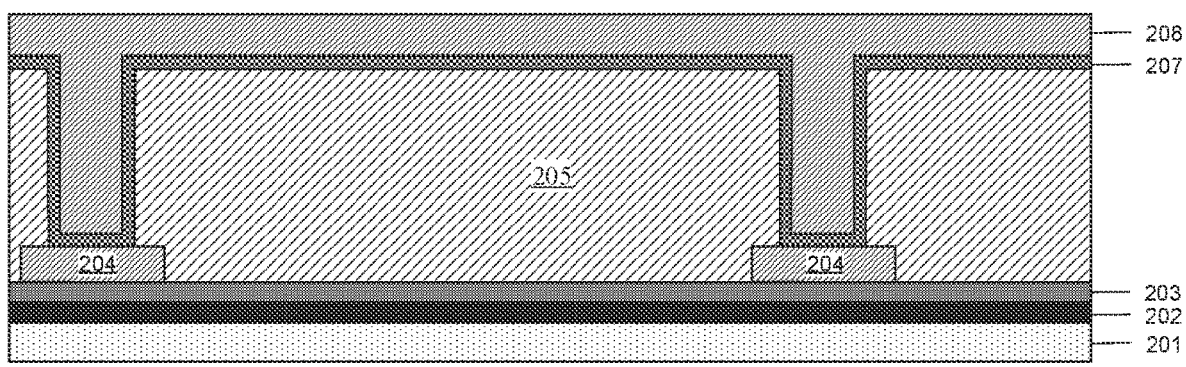

Referring now to FIG. 5, a seed layer 207 is deposited overlying the patterned photoresist 205. Next, referring now to FIG. 6, the openings 206 are filled with a conductive material 208 including, for example, copper, silver, gold, and the like to form conductive vias. In some embodiments, the openings 206 are plated with the conductive material 208 during a plating process, including, for example, electrochemically plating, electroless plating, or the like. In some embodiments, the conductive material 208 overfills the openings 206.

Figure 7:
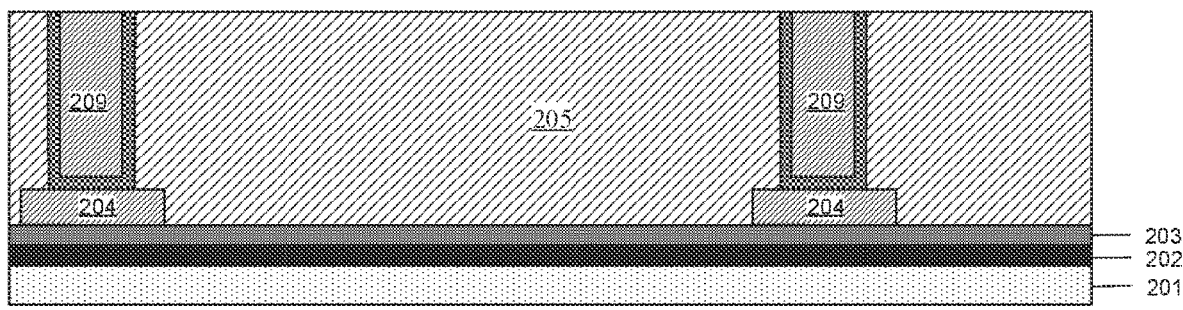

Referring now to FIG. 7, a grinding and a chemical mechanical polishing (CMP) process are performed to remove excess portions of the conductive material 208 over the photoresist 205.

Figure 8:
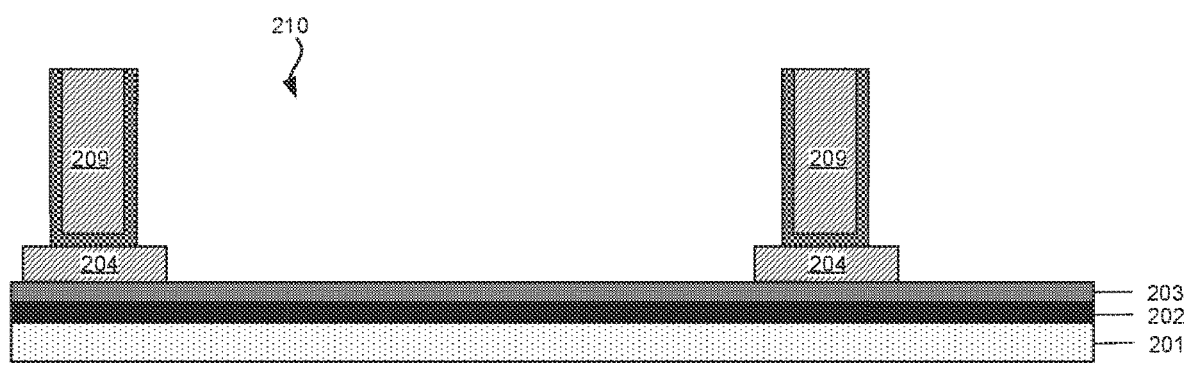

Referring now to FIG. 8, the photoresist 205 is removed. In some embodiments, a plasma ashing or wet strip process is used to remove the photoresist 205. In some embodiments, the plasma ashing process is followed by a wet dip in a sulfuric acid (H2SO4) solution to clean the package 200 and remove the remaining photoresist material.

Thus, conductive vias 209 are formed over the backside RDL 204. Alternatively, in some embodiments, the conductive vias 209 are replaced with conductive studs or conductive wires, including, for example, copper, gold, or silver wire. In some embodiments, the conductive vias 209 are spaced apart from each other by openings 210, and at least one opening 210 between adjacent conductive vias 209 is large enough to dispose one or more semiconductor device dies therein.

Figure 9:
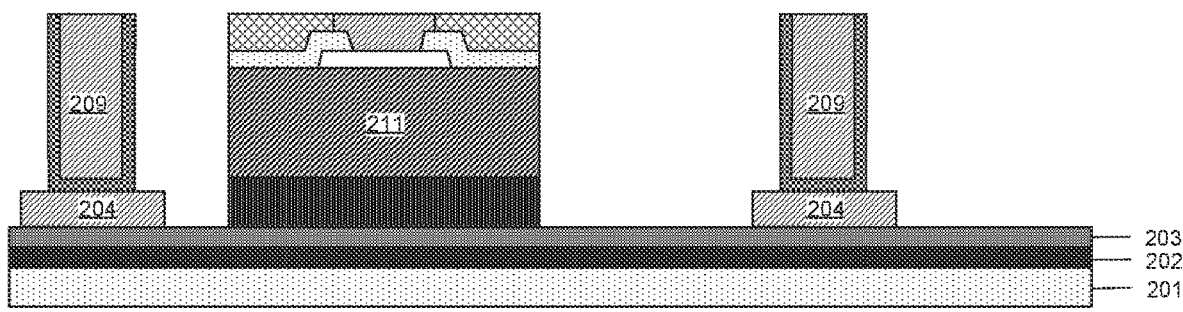

Referring now to FIG. 9, a device die 211 is mounted and attached to the package 200. In some embodiments, an adhesive layer is used to affix the device die 211 to the backside RDL 204. While one device die 211 is illustrated in FIG. 9, in some other embodiments, two or more device dies 211, such as a driver die and a receiver die, can be mounted and attached to the package 200. In some embodiments, a stack of one or more device dies (e.g., device dies 150 and 160 in FIG. 1) can be mounted and attached to the package 200.

Figure 10:
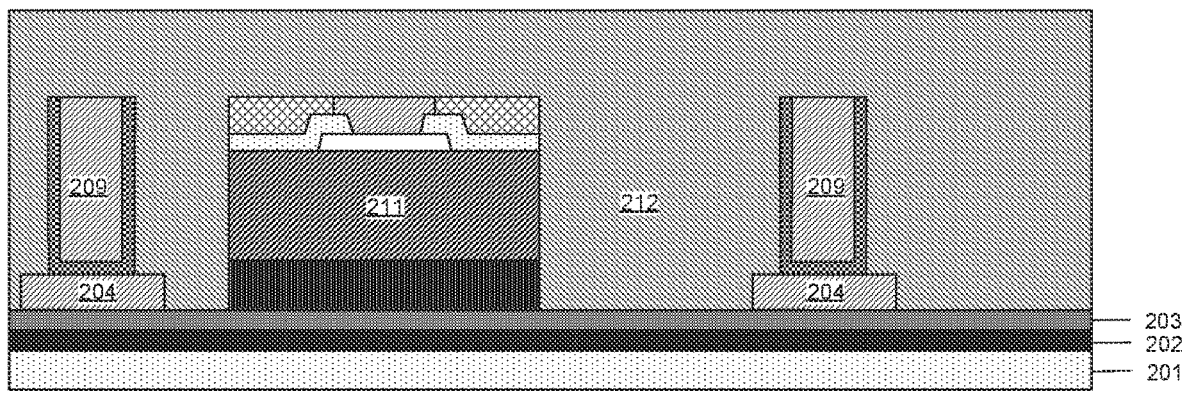

Referring now to FIG. 10, a molding compound 212 is formed in the package 200 after the device die(s) 211 is/are mounted to the backside RDL 204 and/or the polymer base layer 203 in the opening 210. The molding compound 212 is dispensed to fill gaps between the device die(s) 211 and the conductive vias 209, gaps between the adjacent conductive vias 209, and/or gaps between any two of the device die(s) 211. In some embodiments, the molding compound 212 includes any suitable material including, for example, an epoxy resin, a molding underfill, or the like. In some embodiments, compressive molding, transfer molding, and liquid encapsulant molding are suitable methods for forming molding compound 212, but the present disclosure is not limited thereto. For example, the molding compound 212 may be dispensed between the device die(s) 211 and the conductive vias 209 in liquid form. Subsequently, a curing process may be performed to solidify the molding compound 212. In some embodiments, the filling of molding compound 212 may overflow the device die(s) 211 and conductive vias 209 so that the molding compound 212 covers the top surfaces of the device die(s) 211 and the conductive vias 209.

Figure 11:
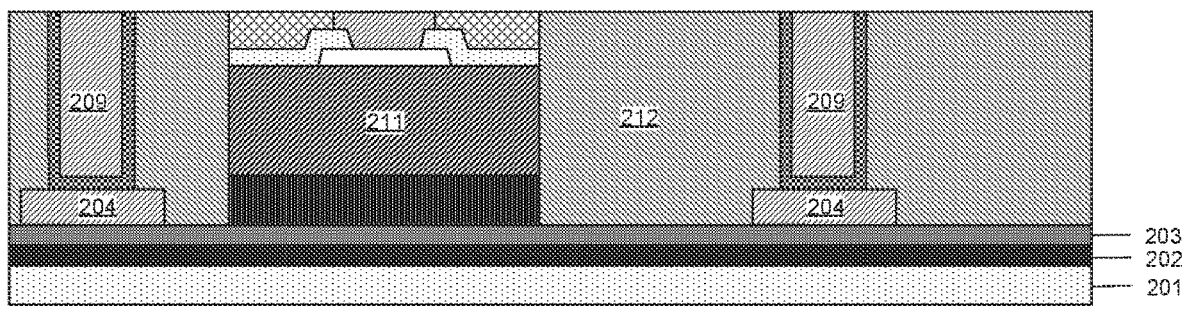

Referring now to FIG. 11, a grinding and a chemical mechanical polishing (CMP) process are performed to remove excess portions of the molding compound 212, and the molding compound 212 is ground back to reduce its overall thickness and thus expose conductive vias 209. Because the resulting structure includes conductive vias 209 that extend through molding compound 212, conductive vias 209 is also referred to as through molding vias, through inter vias (TIVs), and the like. Conductive vias 209 provide electrical connections to the backside RDL 204 in the package 200. In some embodiments, conductive vias 209 can be used with a 3D silicon interposer.

Figure 12:
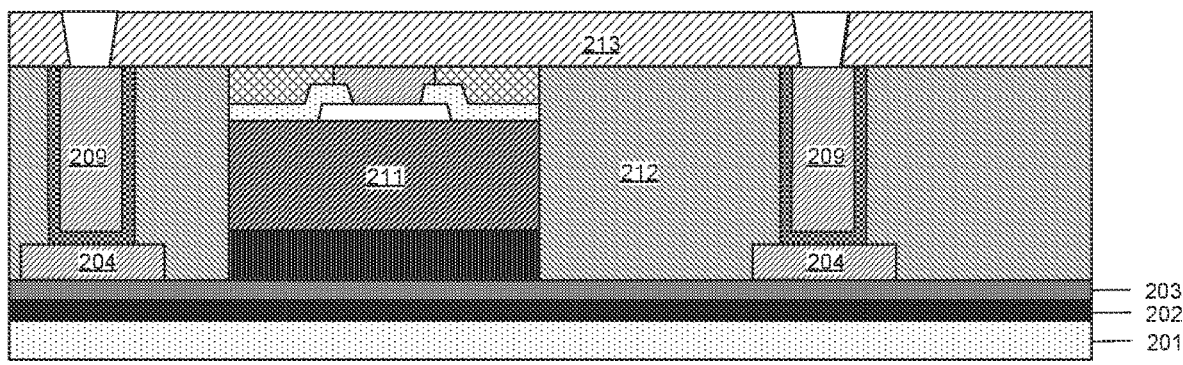

Referring now to FIG. 12, a patterned dielectric layer 213 having openings is formed overlying the molding compound 212. In some embodiments, the dielectric layer 213 includes aluminum nitride, boron nitride, or a combination thereof. In some embodiments, the dielectric layer 213 includes PI, PBO, BCB, epoxy, silicone, acrylates, nano-filled phenol resin, siloxane, a fluorinated polymer, polynorbornene, or the like. In some embodiments, the dielectric layer 213 is selectively exposed to an etchant, including, for example, CF4, CHF3, C4F8, HF, etc., configured to etch the dielectric layer 213 to form the openings. As illustratively shown, the openings expose the conductive pillars and the conductive vias 209. In some embodiments, the openings include one or more via holes, and an overlying metal wire trench. The via holes vertically extends from a bottom surface of the dielectric layer 213 to a bottom surface of the metal trenches, which extend to a top surface of the dielectric layer 213.

Figure 13:
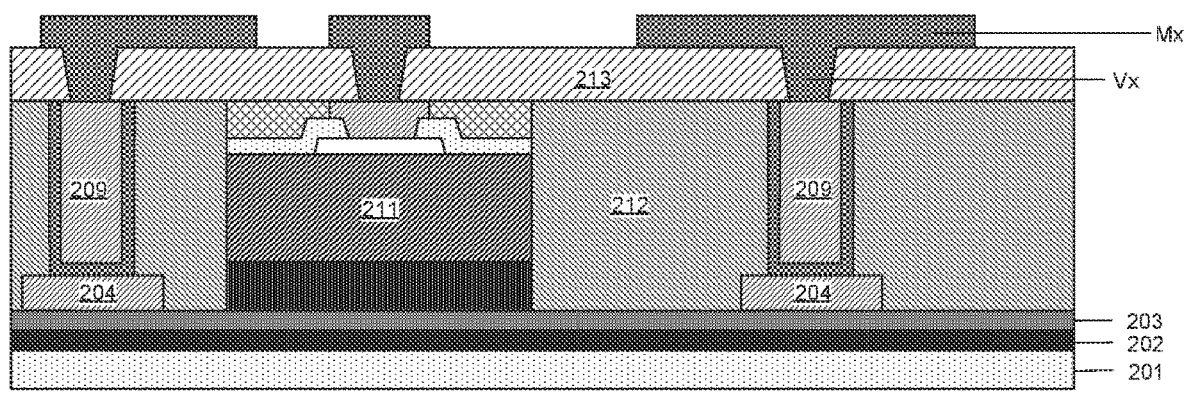

Referring now to FIG. 13, in some embodiments, the openings are filled with an electrically conductive material to form an electrically conductive layer Mx having one or more conductive features (e.g., redistribution lines). For illustration, a seed layer (not shown) is formed in the openings and the conductive material is plated in the openings using, for example, an electrochemical plating process, electroless plating process, or the like. The resulting vias Vx in the dielectric layer 213 are electrically connected to the conductive pillars, or the conductive vias 209, as illustratively shown. In some embodiments, the conductive material, including, for example, copper or aluminum, is deposited by way of a deposition process, a subsequent plating process, and a CMP process, as described above and thus a detailed description for which is omitted here for brevity.

Figure 14:
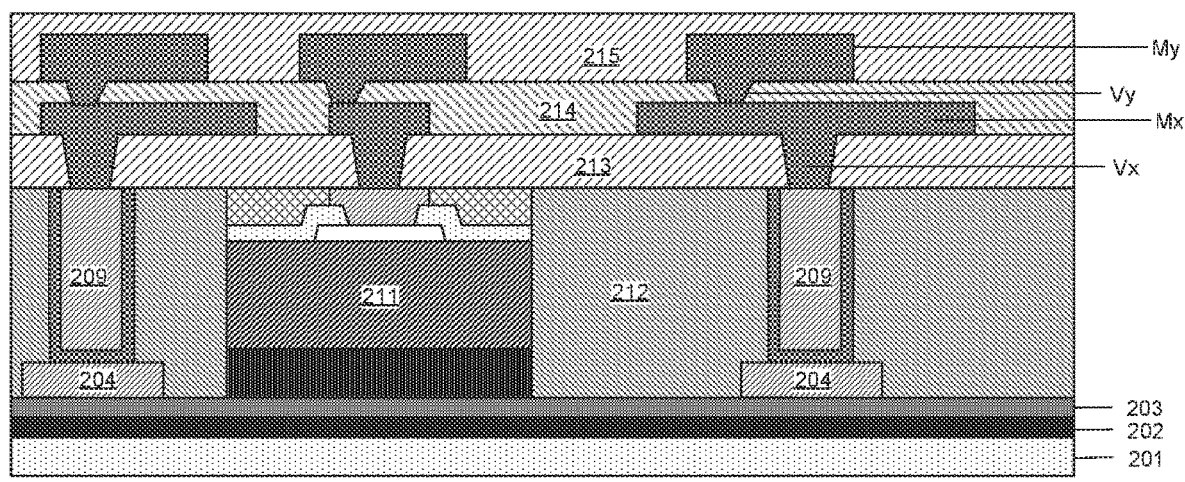

Referring now to FIG. 14, in some embodiments, a dielectric layer 214 having conductive features are formed over the dielectric layer 213. Particularly, an electrically conductive layer My having one or more conductive features (e.g., redistribution lines) and vias Vy are formed between the dielectric layers 214 and 215. In some embodiments, the redistribution lines include conductive features disposed between various dielectric layers. In some embodiments, the dielectric layer 215 is patterned to form openings, and a metal material is formed within the openings to form the redistribution lines.

Figure 15:
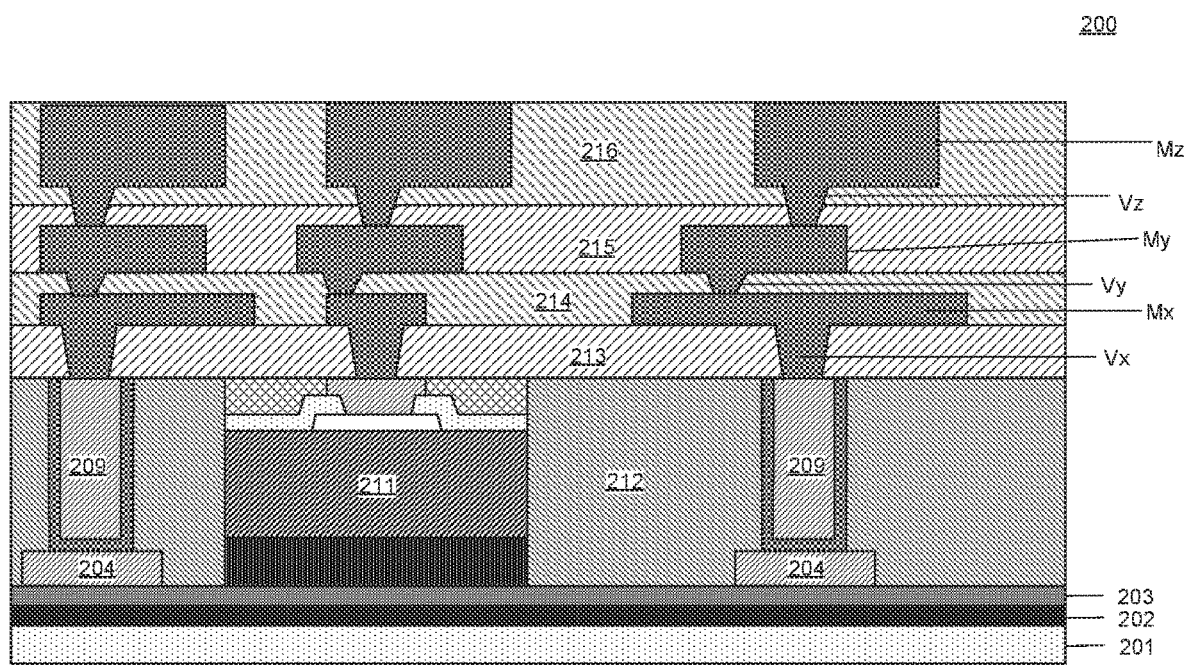

Referring now to FIG. 15, in some embodiments, another additional dielectric layer 216 having conductive features are formed over the dielectric layer 215. Particularly, an electrically conductive layer Mz having one or more conductive features (e.g., redistribution lines) and vias Vz are formed between the dielectric layers 215 and 216. In some embodiments, the width of conductive features within one or more of the electrically conductive layers Mx, My, or Mz may be equal to or substantially greater than 0.8 micrometers. In some embodiments, a spacing of adjacent conductive features within the one or more of the electrically conductive layers Mx, My, or Mz may be equal to or substantially greater than 0.8 micrometers. In some embodiment's, the height of the vias Vx, Vy, or Vz may be about 1.5 micrometers.

As illustratively shown, in some embodiments, the device die 211 is electrically connected to the conductive features of the redistribution lines. In some embodiments, the redistribution lines formed between the dielectric layers are substantially similar to those of the backside RDL 204 both in composition and formation process, and thus their detailed descriptions are omitted here for brevity.

Figure 16:
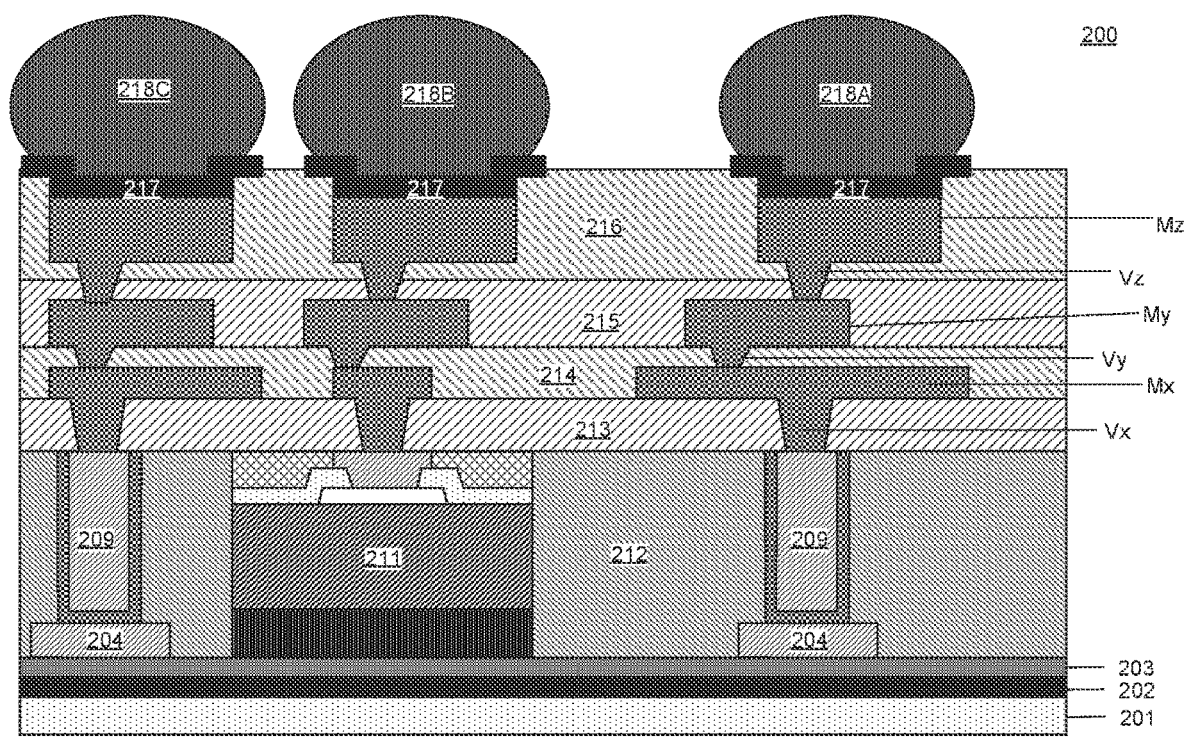

Referring now to FIG. 16, Under Bump Metallurgies (UBMs) 217 are then formed to electrically connect to the electrically conductive layer Mz on the dielectric layer 216. External connectors 218A, 218B, and 218C configured to be the input/output (I/O) pads, including for example solder balls on Under Bump Metallurgies 217, are then formed. In some embodiments, the connectors 218A, 218B, and 218C are ball grid array (BGA) balls, controlled collapse chip connector bumps, and the like disposed on Under Bump Metallurgies 217, which are formed over the redistribution lines. In some embodiments, the connectors 218A, 218B, and 218C are used to electrically connect package 200 to other package components including, for example, another die, interposers, package substrates, printed circuit boards, a mother board, and the like.

Figure 17:
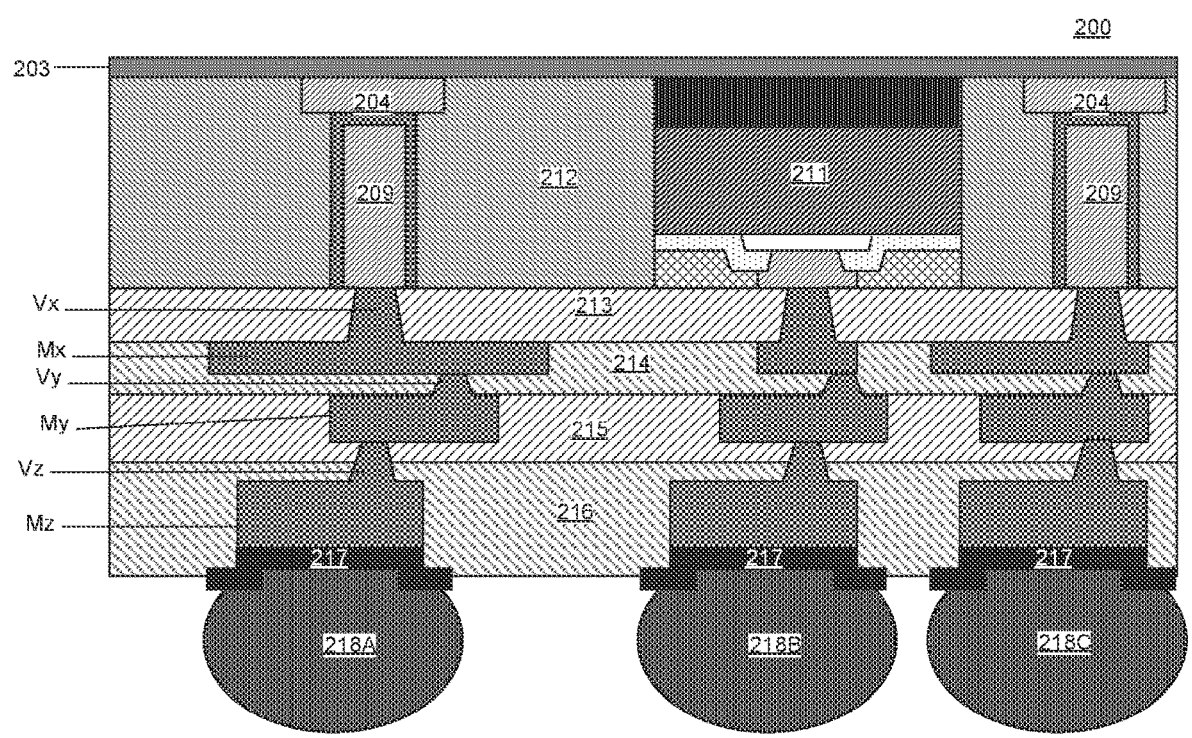
FIG. 17 is a cross sectional view of an Integrated Fan-Out (InFO) package, in accordance with exemplary embodiments of the present disclosure.

In some embodiments, testing is performed at this stage to ensure the package 200 has been suitably formed. Thereafter, the package 200 is de-bonded from the carrier part and flipped over. For example, the carrier 201, and optionally the adhesive layer 202, can be removed from the package 200. FIG. 17 is a cross sectional view of the Integrated Fan-Out (InFO) package 200, in accordance with some embodiments of the present disclosure. As shown in FIG. 17, in the resulting structure in some embodiments, the polymer base layer 203 is left in the resulting package 200 as an insulating and protective layer, but the present disclosure is not limited thereto. In some embodiments, a tape layer is deposited after the adhesive layer 202 is removed. In some embodiments, a laser drilling process is performed to produce the recess and expose the redistribution layer bond pads from the backside RDL 204.

Other packaging technologies can be applied to manufacture the top package 110 and/or the bottom package 120 in various implementation. Possible packaging technologies include, for example, Chip on Wafer on Substrate (CoWoS), Die first Face Down InFO, Die first Face Up InFO, Die last Face Down InFO, etc. The manufacturing process illustrated and described in FIGS. 2 to 16 is a simplified example and not meant to limit the present disclosure.

As shown in FIG. 17, the RDL structure in the package 200 includes one or more dielectric layers filled with a heat conductive dielectric material, such as aluminum nitride, boron nitride, or a combination thereof, and one or more electrically conductive layers. Particularly, the electrically conductive layers in the RDL structure may include metal layers (e.g., layers Mx, My, and Mz). In some embodiments, the metal layers may include aluminum, copper, or a combination thereof, but the present disclosure is not limited thereto. In some embodiments, at least one of the metal layers (e.g., layers Mx, My, and Mz) has a thickness substantially greater than 4 micrometers (e.g., within a range between about 4-10 micrometers).

The top metal layer (e.g., layer Mz) is adjacent to the solder features (e.g., connectors 218A, 218B, and 218C), and the inner metal layer (e.g., layer Mx) is adjacent to the device die 211. The intermediate metal layer (e.g., layer My) is electrically coupled to the top metal layer and the inner metal layer by corresponding vias.

In some embodiments, a thickness of the top metal layer is substantially greater than a thickness of the intermediate metal layer, and the thickness of the intermediate metal layer is substantially greater than a thickness of the inner metal layer. For example, in some embodiments, the thickness of the inner metal layer and of the redistribution line(s) in the inner metal layer may be about 2 micrometers, the thickness of the intermediate metal layer and of the redistribution line(s) in the intermediate metal layer may be about 3 micrometers, and the thickness of the top metal layer and of the redistribution line(s) in the top metal layer may be substantially greater 4 micrometers (e.g., about 6 micrometers), but the present disclosure is not limited thereto.

By providing a relatively thicker and wider top metal layer for power distribution, the RDL structure can provide desirable electrical performances as well as the thermal dissipation. In addition, with the thick top metal layer arranged adjacent to the connectors 218A, 218B, and 218C, the IR-drop effect, which often causes an increase in delay, can also be reduced.

Referring again to FIG. 1, after the top package 110 and the bottom package 120 are manufactured, the top package 110 can be mounted onto the bottom package 120. In some embodiments, a die bonding process is performed to reflow the solder features 170. The top package 110 and the bottom package 120 are electrically coupled together by reflowing the solder features 170. As shown in FIG. 1, the underfill (or a sealing material, encapsulant, etc.), may optionally be inserted or formed between the top package 110 and the bottom package 120. Thereafter, the PoP structure can be mounted to the printed circuit board 140.

In some embodiments, one or multiple thick metal layers (e.g., substantially greater than or equal to 6 micrometers) with dielectric layer(s) filled with the heat conductive dielectric material, such as AlN or h-BN, can also be applied to form the backside RDL structure 128 of the bottom package 120 to further improve the thermal dissipation, but the present disclosure is not limited thereto. For example, the structure of the backside RDL structure 128 may include one or more electrically conductive layers over the molding material and electrically connected to the device die(s), and one or more dielectric layers respectively disposed on the corresponding one or more electrically conductive layers. Accordingly, the device dies 112 and 114 molded in the molding material 116 are electrically coupled to the redistribution layer bond pads 1282 and electrically conductive layer(s) in the backside RDL structure 128 and via wire bonding connections, the RDL structure, vias, contact pads in the top package substrate 118, and the solder features 170.

By applying the thermally conductive horizontal layer, which may be one or more heat conductive dielectric layers, one or more thick metal layers, or both, adjacent to the electrical connectors as the heat dissipating structures, 3DICs consistent with the embodiments described herein can improve the thermal dissipation characteristics of the IC packages by efficiently transferring the heat generated by the stacked device die(s) and trapped in an internal region of a package, and removing the heat through the electrical connectors. Accordingly, 3DICs consistent with the embodiments described herein are able to maintain the operating temperature of memory dies or chips within a desirable range (e.g., within about 80° C.-100° C.). The optimized thermal dissipation performance not only improves the speed and performance of the chips, but also avoids potential electromigration and reliability issues for the 3DIC packages.

In some embodiments, a package structure is disclosed that includes a solder feature; a first redistribution layer structure on the solder feature, the first redistribution layer structure including one or more dielectric layers filled with a heat conductive dielectric material; and a die mounted on and electrically coupled to the first redistribution layer structure.

In some embodiments, a semiconductor device is also disclosed that includes one or more electrical connectors; a stack of one or more dies; and one or more redistribution layer structures electrically coupling the one or more dies with the one or more electrical connectors, the at least one of the one or more redistribution layer structures including a thermally conductive horizontal layer adjacent to the one or more electrical connectors.

In some embodiments, a method is also disclosed that includes attaching a first die in a package; applying a first molding material to surround the first die; forming one or more first electrically conductive layers underlying the first molding material and electrically connected to the first die; and forming one or more first dielectric layers comprising aluminum nitride, boron nitride, or a combination thereof, any of the one or more first dielectric layers being disposed on a corresponding first electrically conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a solder feature configured to be mounted to a printed circuit board;
    a first package comprising:
        a first redistribution layer structure on the solder feature, the first redistribution layer structure comprising dielectric layers comprising hexagonal boron nitride;
        a first die mounted on and electrically coupled to the first redistribution layer structure;
        a second die vertically stacked and connected to the first die via conductive features; and
        a backside redistribution layer structure extending over a top surface of and adjacent to the second die; and
    a second package stacked over the first package, the second package comprising one or more third dies electrically coupled to the backside redistribution layer structure, the one or more third dies in the second package being electrically coupled to the first package through wire bonding;
    wherein the first redistribution layer structure comprises a plurality of first metal layers, a top metal layer of the plurality of first metal layers adjacent to the solder feature being thicker than other metal layers of the plurality of first metal layers, an inner metal layer of the plurality of first metal layers adjacent to the first die being thinner than other metal layers of the plurality of first metal layers, and an intermediate metal layer disposed between the top metal layer and the inner metal layer;
    wherein the backside redistribution layer structure comprises one or more second metal layers, the one or more second metal layers being thicker than the inner metal layer, and electrically connected to the top surface of the second die, and
    wherein the second die adjacent to the backside redistribution layer is not directly connected to the first redistribution layer.

2. The package structure of claim 1, wherein at least one of the plurality of first metal layers has a thickness substantially greater than 4 micrometers.

3. The package structure according to claim 1, wherein the intermediate metal layer electrically is coupled to the top metal layer, and the thickness of the top metal layer is substantially greater than a thickness of the intermediate metal layer.

4. The package structure of claim 3, wherein the inner metal layer is electrically coupled to the intermediate metal layer, the thickness of the intermediate metal layer being substantially greater than a thickness of the inner metal layer.

5. The package structure of claim 3, wherein the top metal layer comprises aluminum, copper, or a combination thereof.

6. The package structure according to claim 1, wherein the backside redistribution layer structure is electrically coupled to the first die and the first redistribution layer structure.

7. The package structure of claim 1, wherein the one or more third dies comprise a plurality of third dies vertically stacked over each other.

8. The package structure of claim 7, wherein the plurality of third dies are respectively electrically coupled to redistribution layer bond pads of the backside redistribution layer structure of the first package via respective wire bonding connections.

9. The package structure of claim 8, wherein the redistribution layer bond pads of the backside redistribution layer structure are disposed on upper portions of a plurality of through package vias in the second package.

10. The package structure of claim 7, wherein the plurality of third dies are embedded in a second molding material.

11. The package structure of claim 7, wherein the plurality of third dies are vertically discrete memory components.

12. The package structure according to claim 1, further comprising:
    one or more integrated passive devices mounted under the first redistribution layer structure and located between the first redistribution layer structure and the printed circuit board.

13. The package structure according to claim 1, wherein a width of conductive features within the plurality of first metal layers is equal to or greater than 0.8 micrometers.

14. The package structure according to claim 13, wherein a spacing of adjacent conductive features within the plurality of first metal layers is equal to or greater than 0.8 micrometers.

15. The package structure according to claim 7, wherein the first die and the second die are mounted beneath or to a passivation layer using a die attach film.

16. The package structure according to claim 15, wherein the passivation layer comprises polybenzoxaxole (PBO) or an Ajinomoto build-up film (ABF).

17. The package structure of claim 1, wherein at least one of the plurality of first metal layers has a thickness within about 4-10 micrometers.

18. A semiconductor device, comprising:
    one or more electrical connectors configured to be mounted to a printed circuit board;
    a stack of a plurality of dies within a first package, the plurality of dies being vertically stacked and connected to each other via conductive features, the plurality of dies including a first die and a second die;
    one or more redistribution layer structures electrically coupling the plurality of dies with the one or more electrical connectors, the one or more redistribution layer structures comprising a first redistribution layer structure and a backside redistribution layer structure electrically coupling one or more of the plurality of dies, the first redistribution layer structure comprising a thermally conductive horizontal layer adjacent to the one or more electrical connectors, the thermally conductive horizontal layer comprising a dielectric layer comprising hexagonal boron nitride; and a second package stacked over the first package, the second package comprising one or more third dies electrically coupled to the backside redistribution layer structure and electrically coupled to the first package through wire bonding, wherein the first die is adjacent to the first redistribution layer structure and is larger than the second die that is adjacent to the backside redistribution layer, and the second die is not directly connected to the first redistribution layer.

19. The semiconductor device of claim 18, wherein the thermally conductive horizontal layer comprises a redistribution line.

20. A method, comprising:

attaching a first die and a second die vertically stacked and connected to each other via conductive features in a first package;

applying a molding material to surround the first die and the second die;

forming one or more first electrically conductive layers underlying the molding material and electrically connected to the first die;

forming first dielectric layers comprising hexagonal boron nitride;

forming one or more second electrically conductive layers over the molding material; and electrically coupling one or more third dies in a second package to the second electrically conductive layers and to the first package through wire bonding, wherein the second die is adjacent to a backside redistribution layer and is not directly connected to a first redistribution layer.

* * * * *